United States Patent [19]

Sato

[11] Patent Number: 5,739,587

[45] Date of Patent: Apr. 14, 1998

[54] SEMICONDUCTOR DEVICE HAVING A MULTI-LATERED WIRING STRUCTURE

[75] Inventor: Hisakatsu Sato, Suwa, Japan

[73] Assignee: Seiko Epson Corporation, Tokyo, Japan

[21] Appl. No.: 603,166

[22] Filed: Feb. 20, 1996

[30] Foreign Application Priority Data

| Feb. 21, 1995 | [JP] | Japan | 7-032707 |
| Feb. 15, 1996 | [JP] | Japan | 8-052273 |

[51] Int. Cl.$^6$ .............................. H01L 23/48; H01L 23/52
[52] U.S. Cl. ............................ 257/758; 257/773; 257/774; 257/786
[58] Field of Search ........................ 257/758, 773, 257/774, 786

[56] References Cited

U.S. PATENT DOCUMENTS

| 4,636,832 | 1/1987 | Abe et al. | 257/786 |
| 5,248,903 | 9/1993 | Heim | 257/786 |
| 5,404,046 | 4/1995 | Matsumoto et al. | 257/773 |
| 5,463,255 | 10/1995 | Isono | 257/774 |
| 5,475,268 | 12/1995 | Kawagoe et al. | 257/774 |
| 5,502,337 | 3/1996 | Nozaki | 257/774 |
| 5,539,247 | 7/1996 | Cheung et al. | 257/774 |
| 5,621,247 | 4/1997 | Hirao et al. | 257/774 |

FOREIGN PATENT DOCUMENTS

| A-61-78151 | 4/1986 | Japan. |
| A-1-130545 | 5/1989 | Japan. |

*Primary Examiner*—Tom Thomas
*Assistant Examiner*—David Ostrowski
*Attorney, Agent, or Firm*—Oliff & Berridge

[57] ABSTRACT

The present invention relates to a pad for connecting external connection terminals such as bonding wires to IC chip. The present invention provides a semiconductor device having upper and lower electrode layers and an interlayer insulation film therebetween, the interlayer insulation film including a through hole which is formed therethrough at a given location. An interlayer connection conductor is embedded in the through hole. For example, the ball-like portion of the bonding wire may be connected to the upper electrode layer such that the ball-like portion perfectly covers the embedded conductor. Such an arrangement will not create any step. Therefore, the bonding area can be easily ensured to facilitate a further formation of more layers. The embedded metal will not be adversely affected by moisture moved into along the bonding wire. The external connection terminal may be of any suitable form such as bump electrode and film carrier. The present invention may be broadly applied as a connection technique for these terminals. It is particularly important to secure a desired bonding area and to provide any measure against larger pressing and separating forces if the connection is made using the bonding wire. In view of improvement of the reliability, the present invention is effective. The through holes may be replaced by grooves into each of which an interlayer connection conductor is embedded. If the plane configuration in the grooves is modified, moisture can be more effectively prevented from entering the semiconductor device through the outer periphery of the IC chip.

11 Claims, 27 Drawing Sheets

SEMICONDUCTOR DEVICE HAVING A MULTI-LATERED WIRING STRUCTURE

BACKGROUND OF THE INVENTION

Field of the Invention

The present invention relates to a semiconductor device and a method of making the semiconductor device, and particularly to an electrode for connecting IC chips to an external connecting terminal such as a bonding wire, and a method of making such an electrode.

FIG. 23A shows the multi-layered wiring structure of a bonding pad which was studied by the inventor prior to the present invention.

The bonding pad includes a semiconductor substrate 10 covered with an oxide film ($SiO_2$ film) 9000. The bonding pad also includes an interlayer insulation film 9200 having an opening which is formed by using both the isotropic and anisotropic etchings and first and second electrode layers 9100, 9300 connected to each other through the opening.

The other bonding pads of the prior art are shown in FIGS. 27A and 27B.

The structure of FIG. 27A is disclosed in Japanese Patent Application Laid-Open No. Sho 61-78151. To reduce a step in a second electrode layer 6, such a structure includes a through hole 7 formed therethrough on the outer side. The second electrode layer 6 is connected to a first electrode layer 5 through the through hole.

In FIG. 27A, reference numeral 1 denotes a semiconductor substrate; 2 an oxide film ($SIO_2$); 3 an interlayer insulation film; 4 a final passivation film; and 140 a bonding wire.

The structure of FIG. 27B is described in Japanese Patent Application Laid-Open No. Hei 1-130545.

The structure of FIG. 27B includes an aluminum electrode layer 14 connected to the bonding wire 140 and a bypass metal layer 16 located below the aluminum electrode layer 14 and connected thereto through a barrier metal layer 13. Even if the aluminum electrode layer 14 is corroded by moisture entering the semiconductor device, the bypass metal layer 16 can maintain the semiconductor device at its normal operation.

The inventor has studied the above prior art from various viewpoints. As a result, the following problems (1)–(3) emerged.

(1) If a three-layer electrode structure is formed using such a technique as shown in FIG. 23A, the aluminum wiring may be disconnected or corroded. This raises a problem in that the bonding area is reduced.

More particularly, when the first, second and third electrode layers 9010, 9110, 9310 are stacked on one another as shown in FIG. 26, part of the aluminum electrode is likely to be thinned or disconnected due to the steep inclination of the steps. A place shown by a one-dot-chain line 9500 in FIG. 26 has an increased risk of disconnecting the wiring.

As shown by arrow in FIG. 26, the aluminum electrodes are also easily corroded by moisture entering along the bonding wire 140 or from the outer periphery of the semiconductor chip.

When the semiconductor device is multi-layered, the bonding area is further reduced. More particularly, the dotted lines P1, P2 and P3 in FIG. 26 indicate boundaries of bonding areas on the electrode layers 9010, 9110 and 9310, respectively. When the electrodes are multi-layered, the area of the lowest electrode layer must be necessarily increased to secure its bonding area. It is thus difficult to form the bonding pad with an increased density.

(2) The structure of FIG. 27A has its reduced inter-layer steps. However, the area occupied by the electrodes will increase in the presence of the electrode 5 on the outer side of the area connected to the bonding wire 140. It is also difficult to form the bonding pad with an increased density.

(3) The structure of FIG. 27B will have increased steps if the electrodes are further multi-layered. The area occupied by the bonding pad is increased since the electrodes extend in the lateral direction. This also makes the formation of high-density bonding pad difficult.

SUMMARY OF THE INVENTION

It is therefore an object of the present invention to provide a semiconductor device having a bonding pad, that is, its external connection terminal areas which can be formed with an increased density and having an improved reliability.

Another object of the present invention is to provide a method of effectively making such a semiconductor device.

In one preferred embodiment of a semiconductor device according to the present invention, a semiconductor device comprises upper and lower electrode layers and an inter-layer insulation film therebetween, the inter-layer insulation film including a through hole formed therethrough at given locations. The through hole includes an interlayer connection conductor embedded therein. Preferably, the ball-like portion of a bonding wire is connected to the upper electrode layer such that the ball-like portion perfectly covers the embedded conductor.

Such a structure has no step. Thus, the bonding areas can be more easily ensured to facilitate the formation of multi-layer structure. Furthermore, the embedded metal will not be adversely affected by moisture entering along the bonding wire.

The external connection terminals may be formed by any of various materials such as bump electrodes, film carriers. The present invention can be broadly applied as a connection technique for these terminals. It is particularly important to secure a desired bonding area and to provide any measure against larger pressing and separating forces if the connection is made using the bonding wire. In view of improvement of the reliability, the present invention is effective.

In another preferred embodiment, the multi-layered wiring structure of the bonding pad is preferably formed through a method of producing a multi-layered wiring structure that defines an internal circuit.

In still another preferred embodiment, the bonding pad may be formed by a multi-layered structure including three or more layers, using the structure that includes interlayer connection conductors each embedded into the respective one of through holes.

In a further preferred embodiment, the through-holes may be replaced by grooves into each of which an inter-layer connection conductor is embedded. If the plane configuration in the grooves is modified, moisture can be more effectively prevented from entering the semiconductor device through the outer periphery of the IC chip.

In a further preferred embodiment, it is desirable that a plurality of embedded conductor layers are disposed in a matrix. The configuration of the matrix may be of any of various forms such as circle.

In a further preferred embodiment, a guard ring is preferably formed along the outer periphery of the IC chip to further increase the prevention of moisture from entering the semiconductor device. It is desirable that the guard ring is maintained at a given potential.

In one preferred embodiment of a semiconductor device making method according the present invention, the multi-layered wiring structure of the internal circuit is formed through the same process as forming the multi-layered bonding pad and so on. The method comprises the steps of forming through holes in the insulation film and embedding conductor layers in the through holes.

Thus, the bonding pad and the like may be formed through the well-known VLSI making technique in which a metal or other conductor is embedded in a fine through hole.

In another preferred embodiment of the method according to the present invention, the guard ring is produced at the same time when the multi-layered wiring structure is formed.

DETAILED DESCRIPTION OF THE PREFERRED EMBODIMENTS (1) First Embodiment

Figure 1:
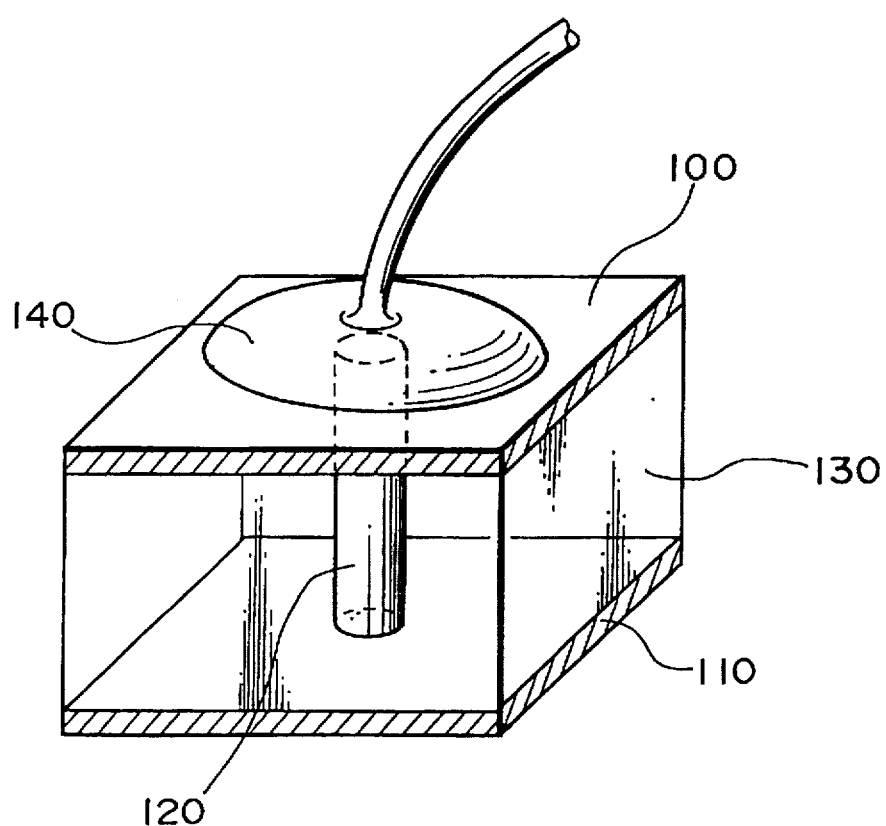
FIG. 1 is a view of the first embodiment of a semiconductor device constructed in accordance with the present invention.

FIG. 1 is a view of the first embodiment of a semiconductor device constructed in accordance with the present invention.

The structure shown in FIG. 1 comprises upper and lower electrode layers 100, 110 and an interlayer insulation film 130 between the upper and lower electrode layers. The central portion of the interlayer insulation film 130 includes a through hole formed therethrough, into which an interlayer connection conductor 120 is embedded. The structure also comprises a bonding wire 140 having a ball-like portion which is connected to the upper electrode layer 100 to cover the overall embedded conductor 120.

Such a structure will not create any step. Therefore, the bonding area can be easily ensured to facilitate a further multi-layered structure.

The embedded metal 120 will not be adversely affected by moisture entering the structure along the bonding wire 140.

(2) Second Embodiment

Figure 2:
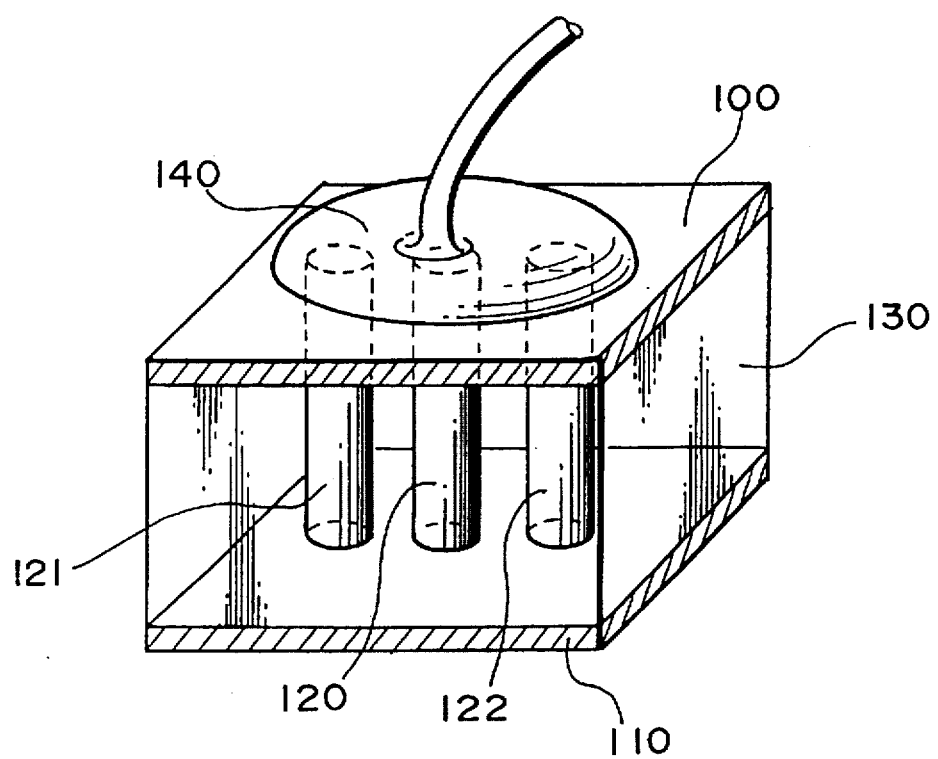
FIG. 2 is a view of the second embodiment of a semiconductor device constructed in accordance with the present invention.

FIG. 2 is a view of the second embodiment of a semiconductor device constructed in accordance with the present invention.

The second embodiment is characterized by that further interlayer connection conductors 121 and 122 are disposed around the interlayer connection conductor 120 shown in FIG. 1.

These conductors 120–122 function not only to electrically connect the upper and lower electrode layers 100, 110, but also to provide a support between the upper and lower electrode layers 100, 110. Therefore, any crack will not be easily created in the interlayer insulation film 130 on bonding.

(3) Third Embodiment

Figure 3:
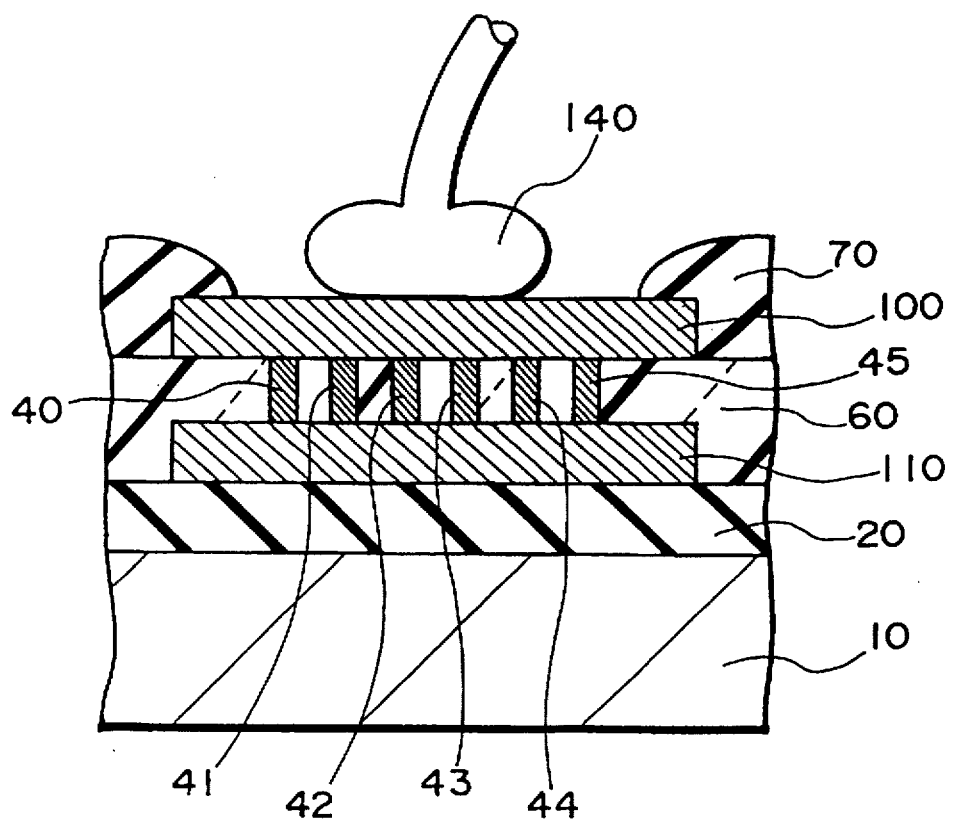
FIG. 3 is a sectional view of the third embodiment of a semiconductor device constructed in accordance with the present invention.

FIG. 3 is a view of the third embodiment of a semiconductor device constructed in accordance with the present invention.

The third structure includes a semiconductor substrate 10, a SiO$_2$ film 20 formed over the semiconductor substrate 10 and a double-layer wiring structure formed on the SiO$_2$ film 20. The double-layer wiring structure includes upper and lower electrode layers 100, 110, a plurality of interlayer connection conductors 40–45, an interlayer insulation film 60 and another interlayer insulation film 70. The upper electrode layer 100 is connected to the bonding wire 140.

Through holes into which the interlayer connection conductors 40–45 are embedded are required to have a sufficient diameter to completely receive the respective conductor, which is equal to about 1 µm.

Figure 21A:
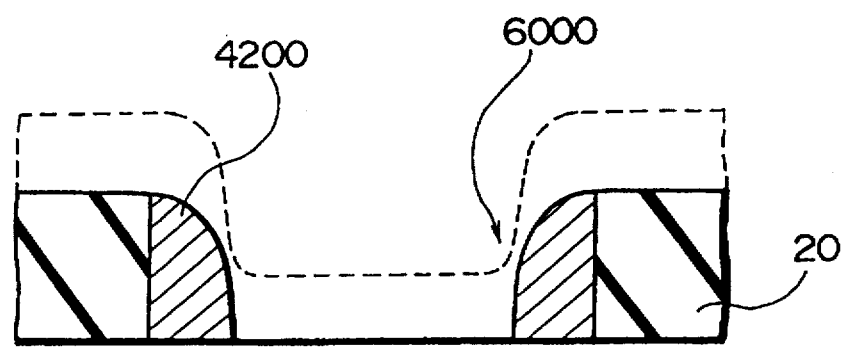
FIG. 21A is a view of a conductor layer embedded in a through hole that is too large and FIG. 21B is a view of a conductor layer embedded in a suitable through hole.

For example, FIG. 21A shows a through hole 6000 that is too large. If a conductor 4200 is deposited in such a through hole 6000 with the whole surface thereof being etched, the conductor 4200 will remain in only a part of the through-hole.

Figure 21B:
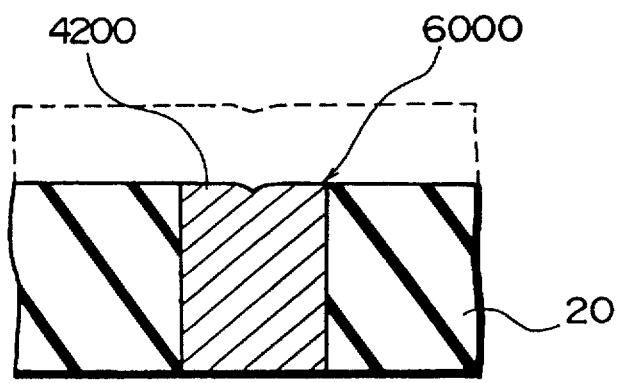

If the diameter of a through-hole is smaller in some extent as shown in FIG. 21B, the through hole 6000 is substantially completely filled with the conductor 4200. The top face of the conductor 4200 has the same height with the top face of the interlayer insulation film 20. Thus, the multi-layered electrode structure can be more flattened.

Figure 22A:
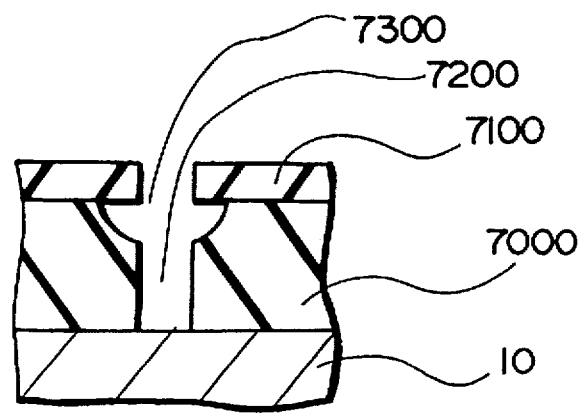
FIGS. 22A and 22B are views used to illustrate problems raised when a through-hole is formed through an isotropic etching.
Figure 22B:
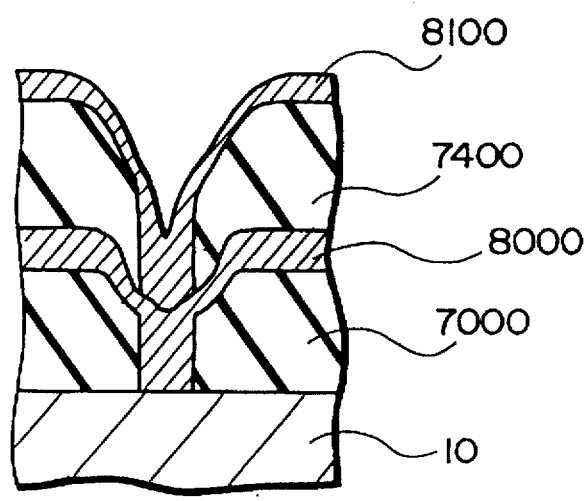

The through hole must be formed only by using anisotropic etching process such as Reactive Ion Etching (RIE). If through holes 7300 and 7200 are formed by using a combination of isotropic and anisotropic etchings as shown in FIG. 22A, the resulting multi-layered structure will have steep inclination as shown in FIG. 22B. Such a structure is not practicable.

Experiments have showed the fact that the structure of the present invention shown in FIG. 3 is superior in bondability.

Figure 23A:
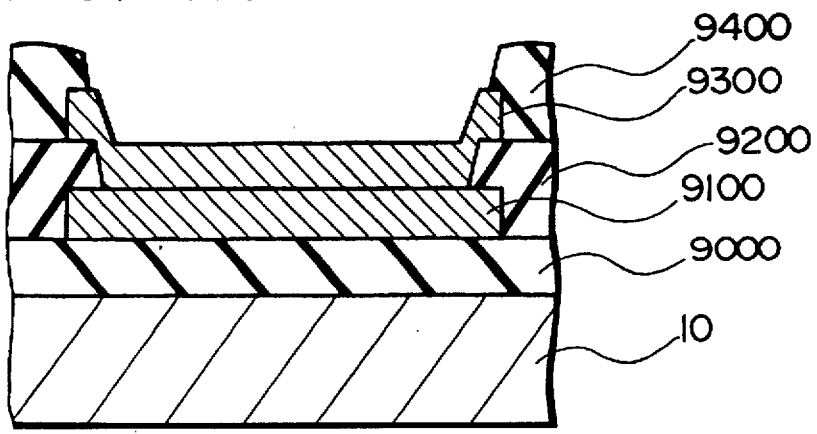
FIGS. 23A, 23B and 23C are views used to illustrate different bondabilities in various electrode structures.
Figure 23B:
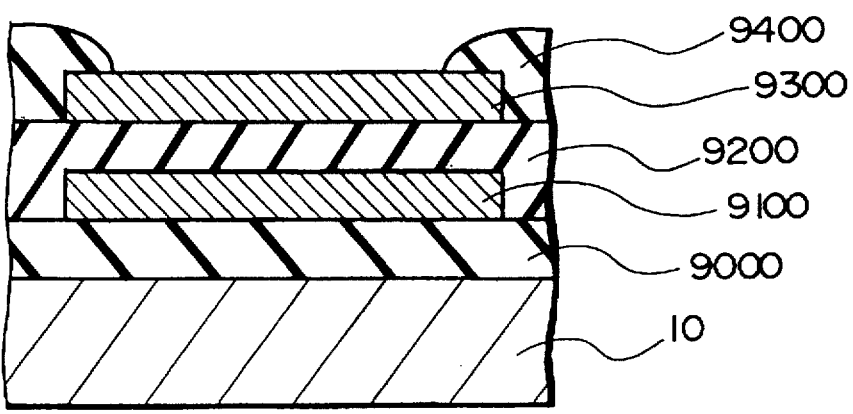
Figure 23C:
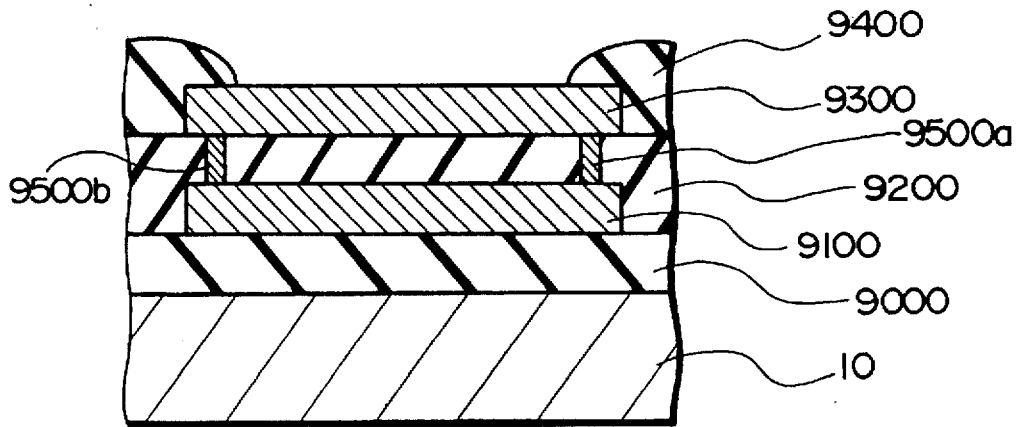
Figure 24:
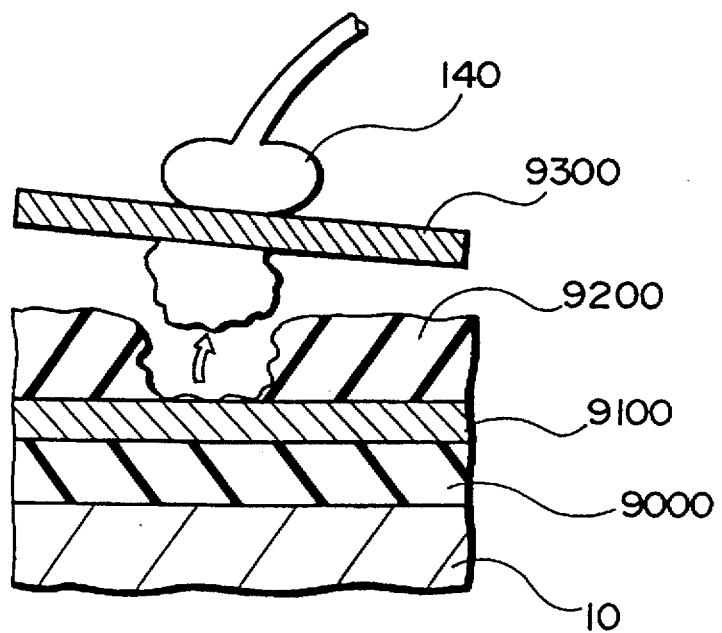
FIG. 24 is a view used to illustrate the problem in the structure of FIG. 23B.

The experiments used three types of bonding pad structures which are shown in FIGS. 23A, 23B and 23C.

The experiments were carried out by applying a given load to the upper electrode layers connected to the respective bonding wires and then pulling the bonding wires to check whether or not peeling of bonding pad was created. The results of these experiments are shown in Table 1.

TABLE 1

| Wafer No. | Number of Peelings in Different Pad Structures | | | | |
|---|---|---|---|---|---|
| | #01 | #02 | #03 | #04 | Total |
| Structure 1 | 2/16 | 2/16 | 3/16 | 2/16 | 9/64 |
| Structure 2 | 0/16 | 0/16 | 2/16 | 0/16 | 2/64 |
| Structure 3 | 0/16 | 0/16 | 0/16 | 0/16 | 0/64 |

In Table 1, the structure 1 corresponds to that of FIG. 23B; the structure 2 corresponds to that of FIG. 23C; and the structure 3 corresponds to that of FIG. 23A.

As will be apparent from Table 1, the structure of FIG. 23A (i.e., the structure 3 in Table 1) is subjected to no peeling and has the highest strength against bonding impact.

On the other hand, all the wafers according to the structure of FIG. 23B (i.e., the structure 1 in Table 1) are subjected to pad peeling and has the lowest strength with variety.

This is believed to be because a crack is likely to be created in a hard interlayer insulation film (e.g., CVDSiO$_2$ film) with the crack promoting the pad peeling.

Figure 25:
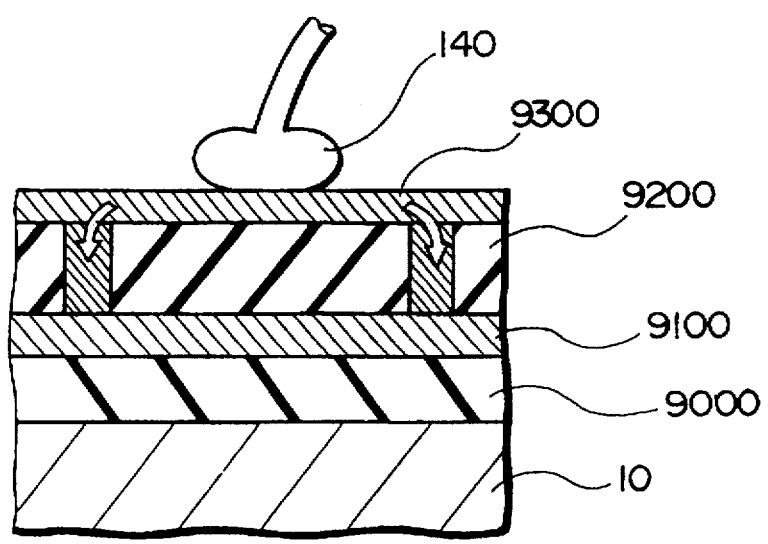
FIG. 25 is a view used to illustrate advantages in the structure of FIG. 23C.
Figure 26:
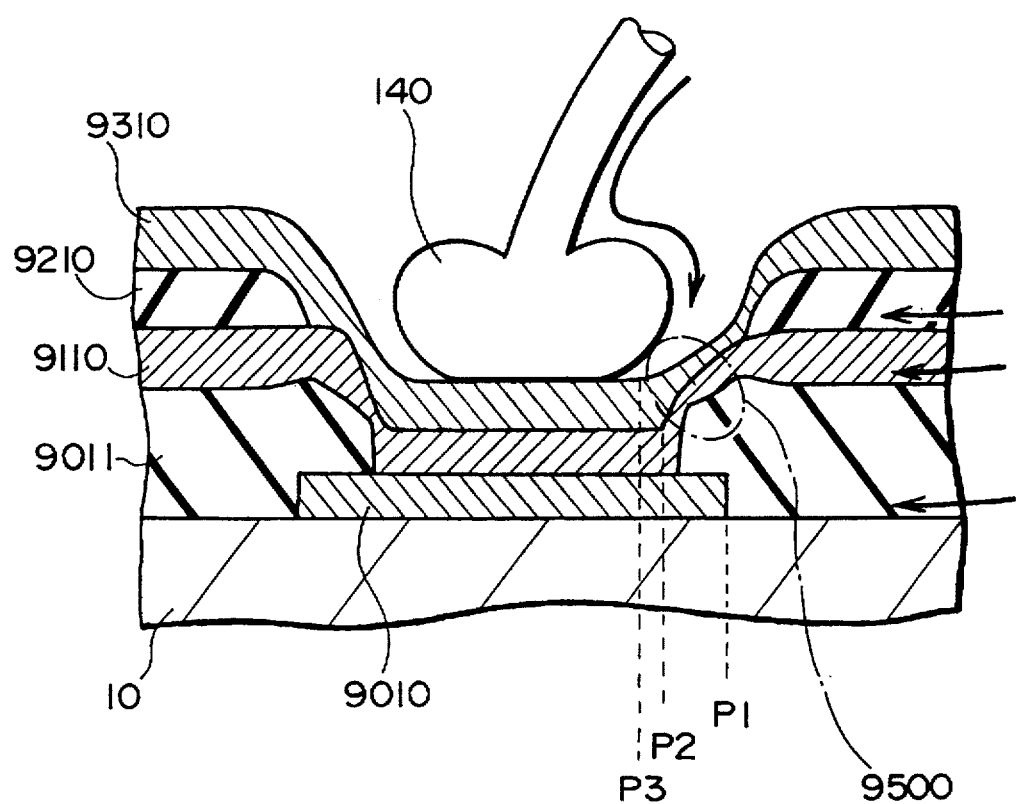
FIG. 26 is a view used to illustrate the problems that have been bared by the inventor prior to the present invention.
Figure 27A:
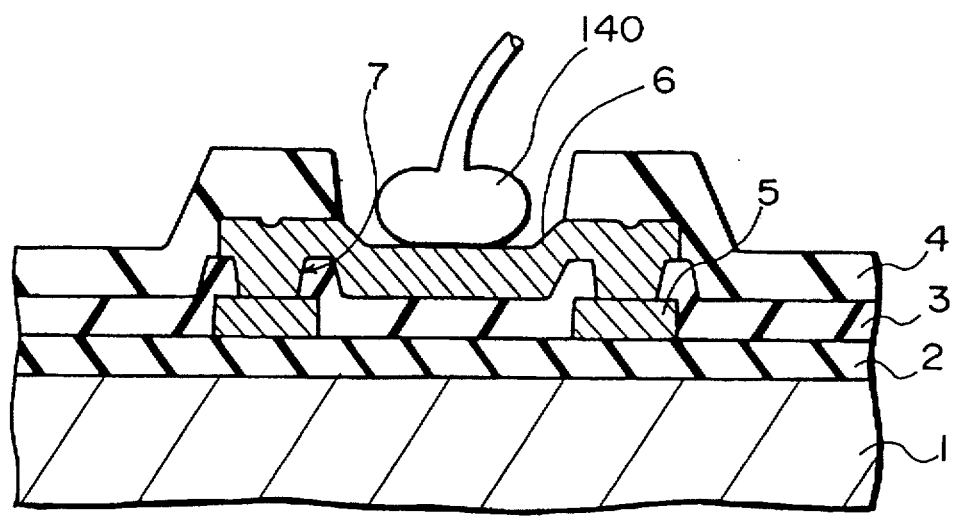
FIGS. 27A and 27B are views used to illustrate problems in the prior art.
Figure 27B:
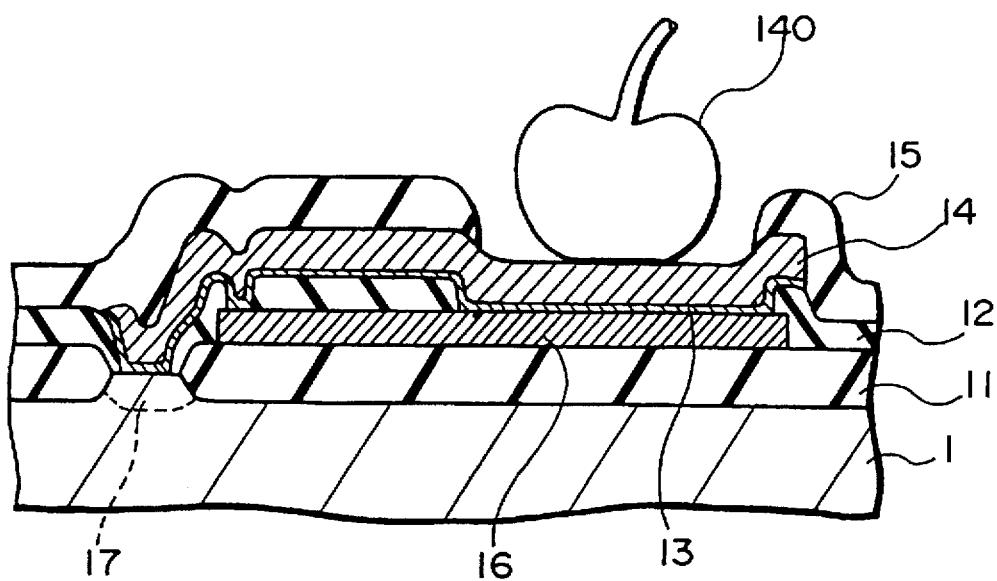

The structure of FIG. 23C according to the present invention (i.e., the structure 2 in Table 1) provides support columns 9500a, 9500b formed by conductors to absorb the bonding impact, as shown in FIG. 25. Thus, a crack less tends to be created in the interlayer insulation film (e.g., CVDSiO$_2$ film). According to the structure of the present invention, therefore, the bondability can be enhanced. More particularly, the distortion of the silicon oxide film having its hardness higher than that of the metal wiring layer is suppressed to reduce the creation of cracks in the silicon oxide film. This is effective against the pad peeling and enhances the bondability.

The layout of interlayer connection conductors (e.g., planar pattern) will be described below.

Figure 4:
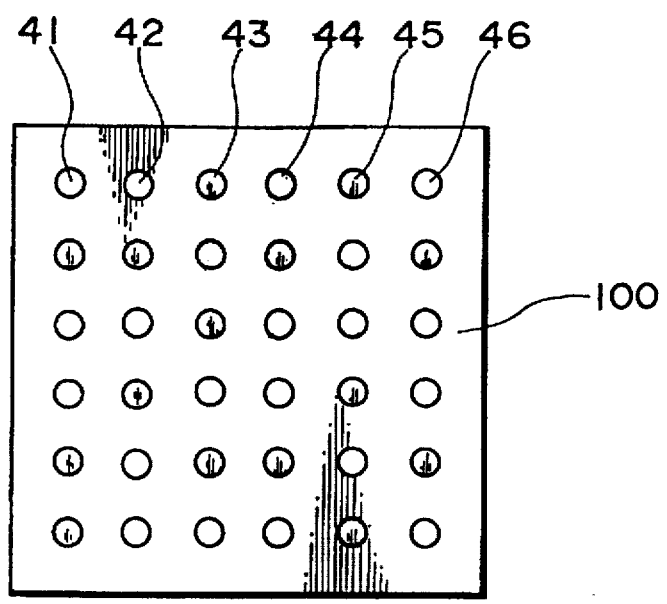
FIG. 4 is a view showing a conductor layout in the present invention.

When the interlayer connection conductors 41–46 and so on are orderly disposed into a matrix as shown in FIG. 4, the layout density can be increased. Since the bonding impact is evenly absorbed by the respective conductors, a crack less tends to be created in the interlayer insulation film.

Figure 5:
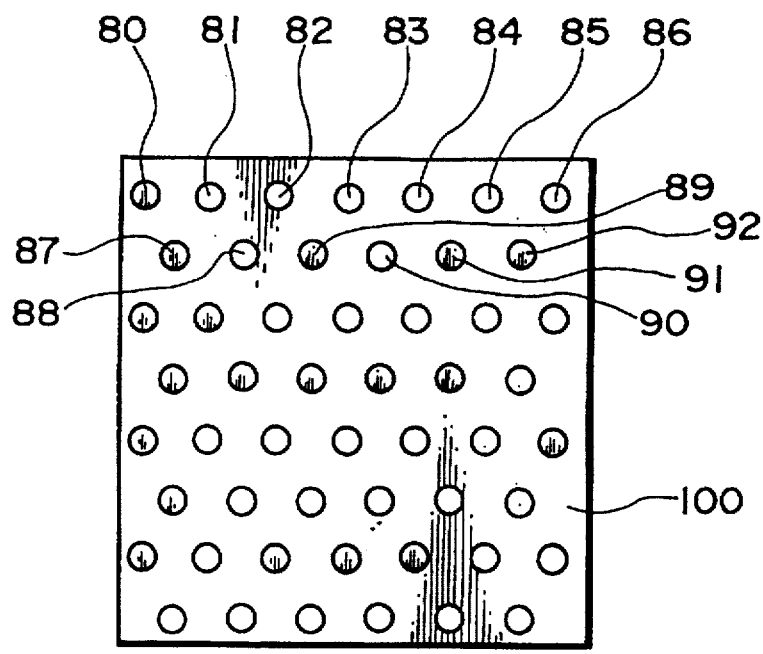
FIG. 5 is a view showing another conductor layout in the present invention.

When the matrix includes conductors 80–86 in odd number lines and conductors 87–92 in even number lines with the conductors in the adjacent lines being staggered as shown in FIG. 5, the interlayer connection conductors can be disposed with a further increased density.

Figure 6:
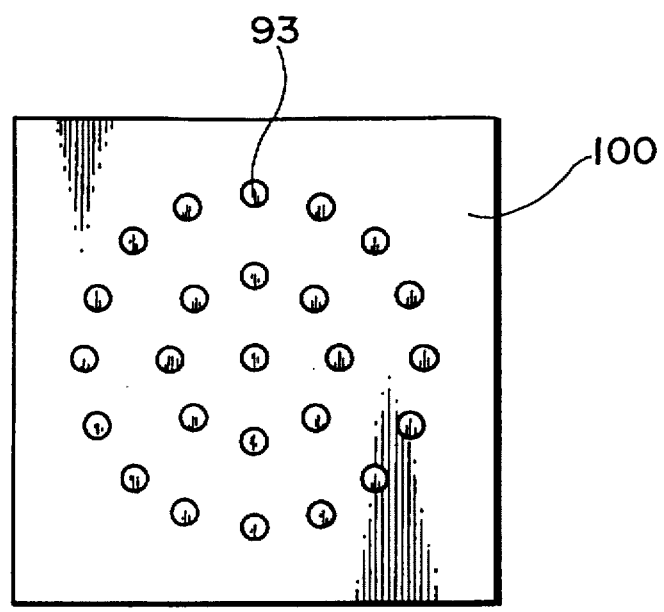
FIG. 6 is a view showing still another conductor layout in the present invention.

When the interlayer connection conductors are disposed into concentric circles for the ball-like configuration of the bonding wire as shown in FIG. 6, any redundancy in the layout can be avoided. Since the bonding impact is highest at the center of the bonding pad electrode, the bondability can be further improved by forming more through-holes in the center of the bonding pad electrode.

Figure 7:
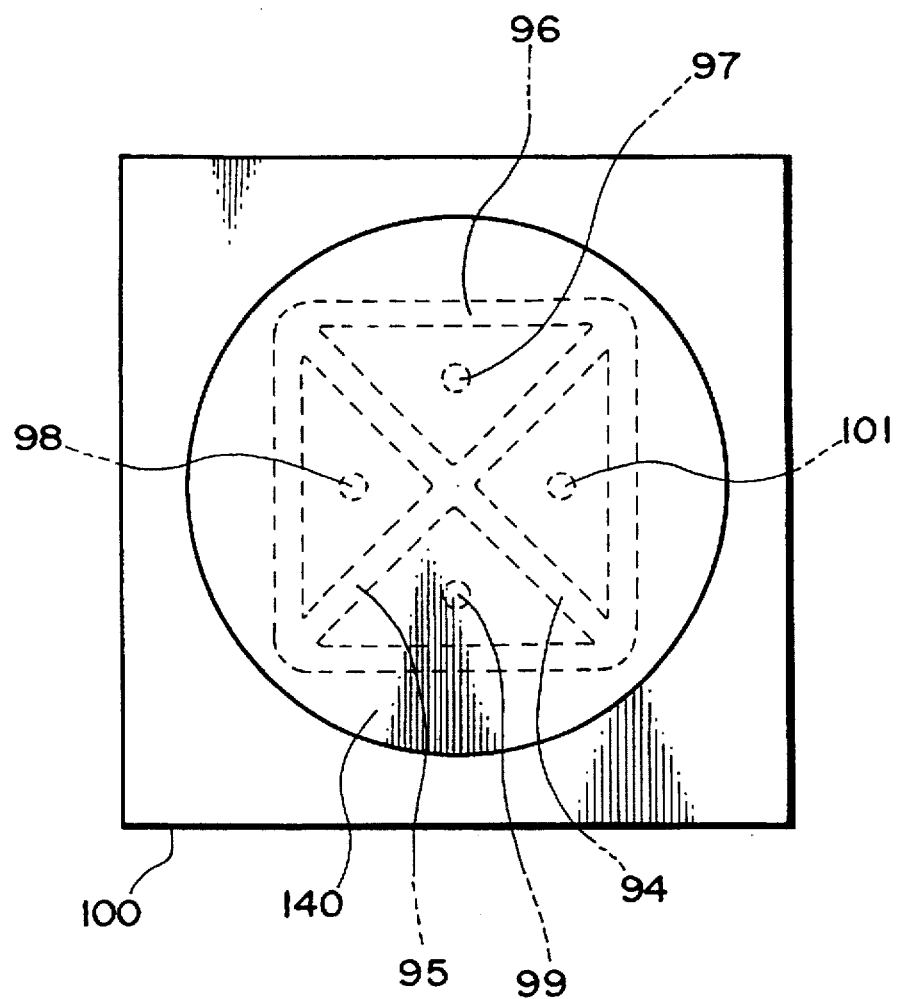
FIG. 7 is a view showing a further conductor layout in the present invention.

As shown in FIG. 7, grooves may be formed so that conductors 94, 95 and 96 are embedded in the grooves. The conductors 94, 95 and 96 function as walls for preventing any moisture from entering through the periphery of the semiconductor chip. Therefore, the moisture will not reach conductors 97, 98 and 99 that are located within the inner area surrounded by the grooves. This prevents corrosion.

Since the conductors 94–99 are covered with the ball-like portion of the bonding wire 140 as shown in FIG. 7, the conductors are also protected from the moisture entering along the bonding wire 140.

Figure 8:
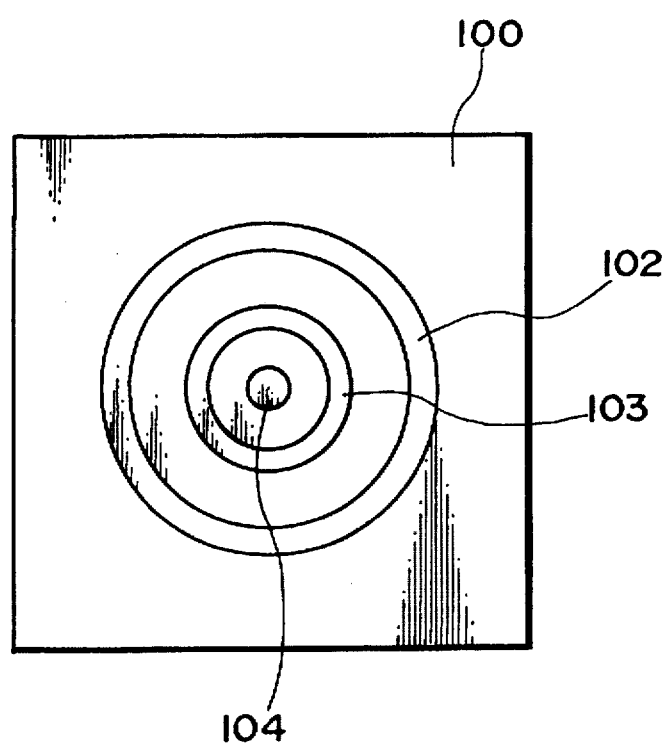
FIG. 8 is a view showing a further conductor layout in the present invention.

As shown in FIG. 8, furthermore, grooves may be formed in concentric circles around a through hole. Conductors 102, 103 and 104 may be embedded into the grooves and through hole. The double-groove layout can reliably prevent the moisture from entering the semiconductor device.

Figure 9A:
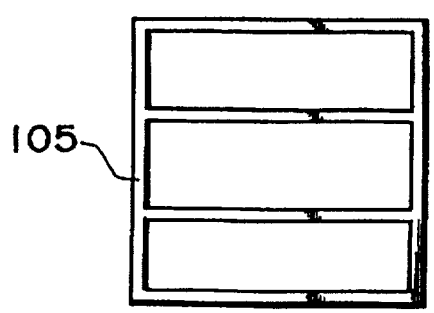
FIG. 9A is a view showing a conductor layout.
Figure 9B:
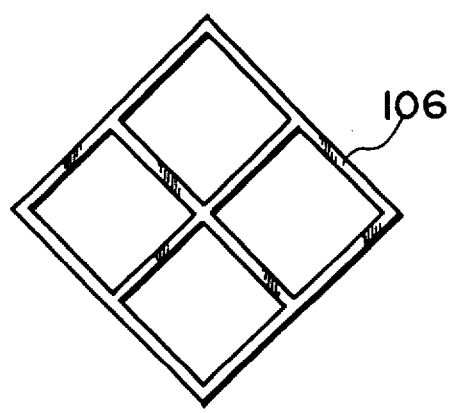
FIG. 9B is a view showing another conductor layout.
Figure 9C:
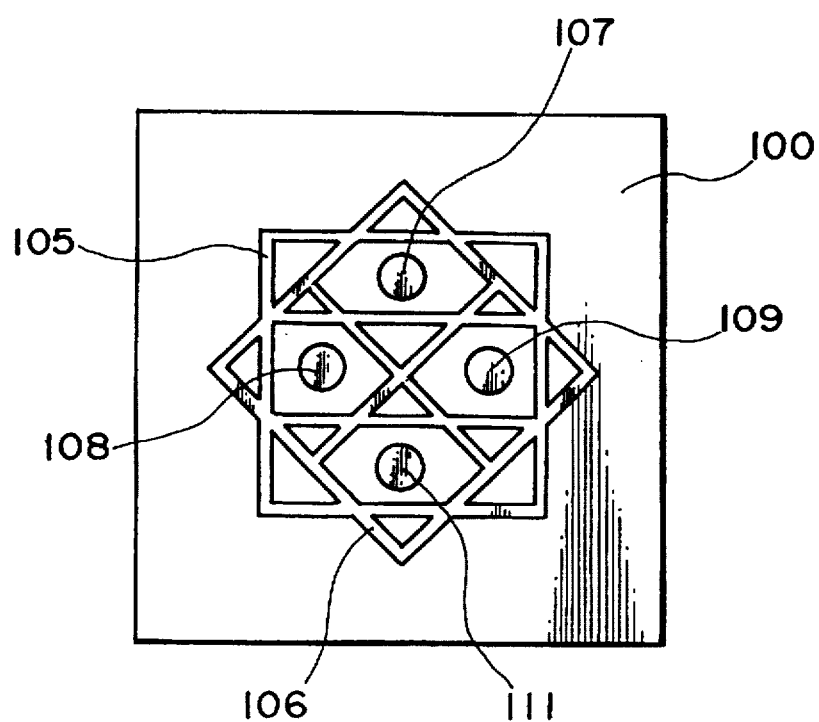
FIG. 9C is a view showing still another conductor layout.

Conductors may be disposed in such a layout as shown in FIG. 9C. The layout of FIG. 9C is provided from a combination of the groove layouts shown in FIGS. 9A and 9B.

(4) Fourth Embodiment

Figure 10A:
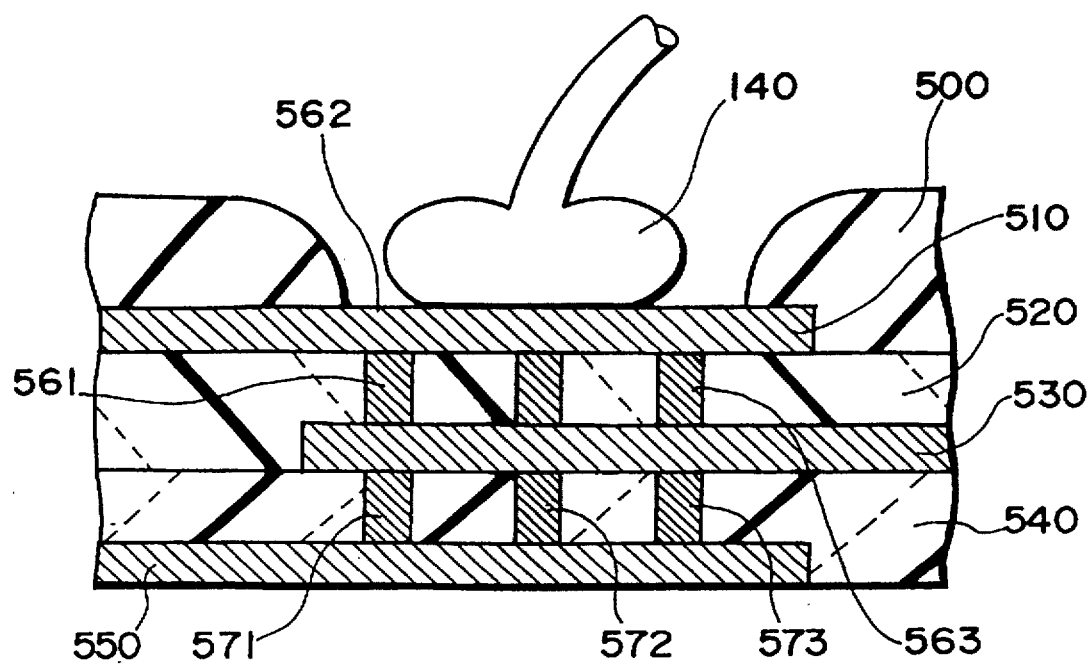
FIG. 10A is a sectional view showing the structure of the fourth embodiment of a semiconductor device constructed in accordance with the present invention and FIG. 10B is a plan view showing the positional relationship between various parts in the structure of FIG. 10A.
Figure 10B:
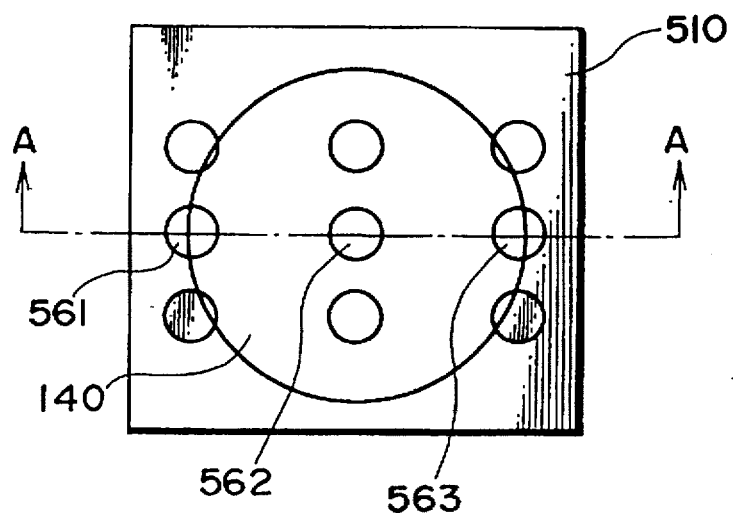

FIG. 10A is a plan view of the fourth embodiment of a semiconductor device constructed in accordance with the present invention while FIG. 10B is a view showing the planar positional relationship between the primary parts in the structure of FIG. 10A.

The structure of FIG. 10A has a three-layer electrode structure which comprises a top electrode layer 510, an intermediate electrode layer 530 and a bottom electrode layer 550. The top and intermediate electrode layers 510, 530 are connected to each other through interlayer connection conductors 561–563 while the intermediate and bottom electrode layers 530, 550 are connected to each other through inter-layer connection conductors 571–573.

In the structure of FIG. 10A, each of the top, intermediate and bottom electrode layers 510, 530, 550 has a lateral extension in a given direction so as to function as a connection wire to the internal circuit. However, the present invention is not limited to such an arrangement, but may have only one extension usable as a leading wire. Even if the top electrode layer has an extension functioning as a leading wire, the interlayer connection conductors 561–563 are required to ensure the good bonding.

Figure 11:
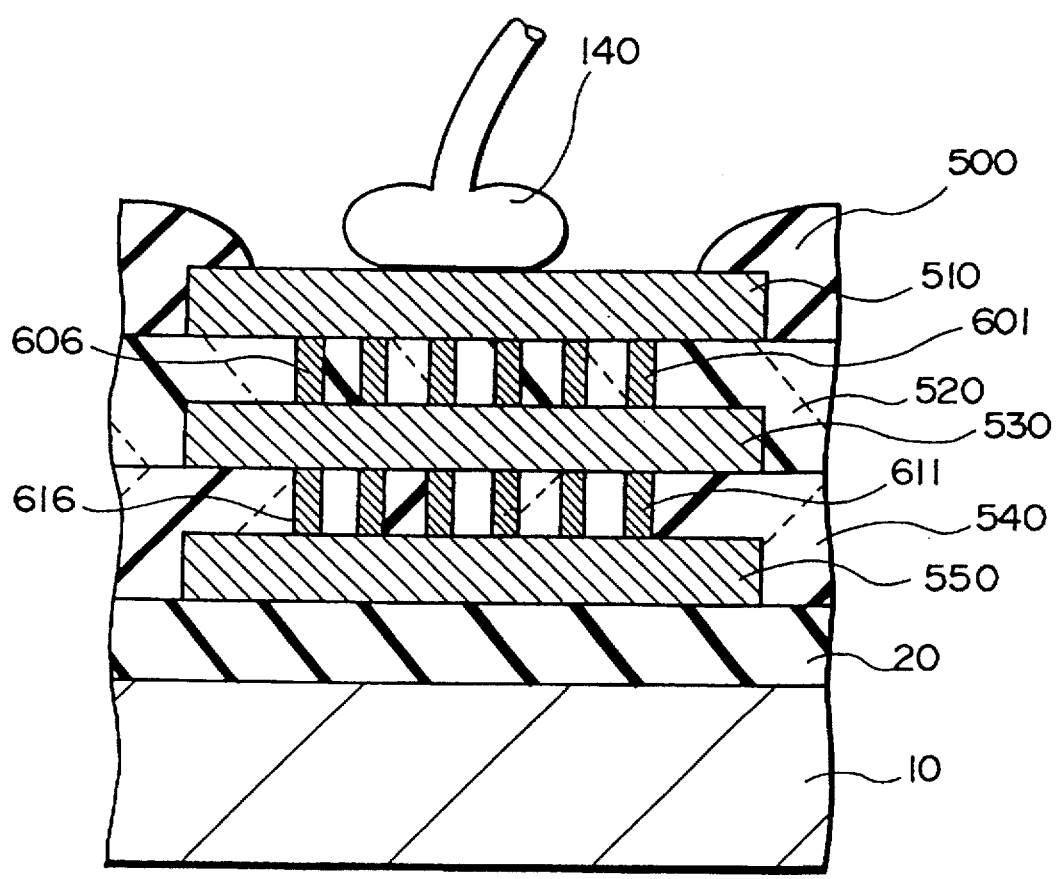
FIG. 11 is a sectional view of a modification of the fourth embodiment.

The number of interlayer connection conductors may be increased, if necessary, as shown in FIG. 11.

Figure 12:
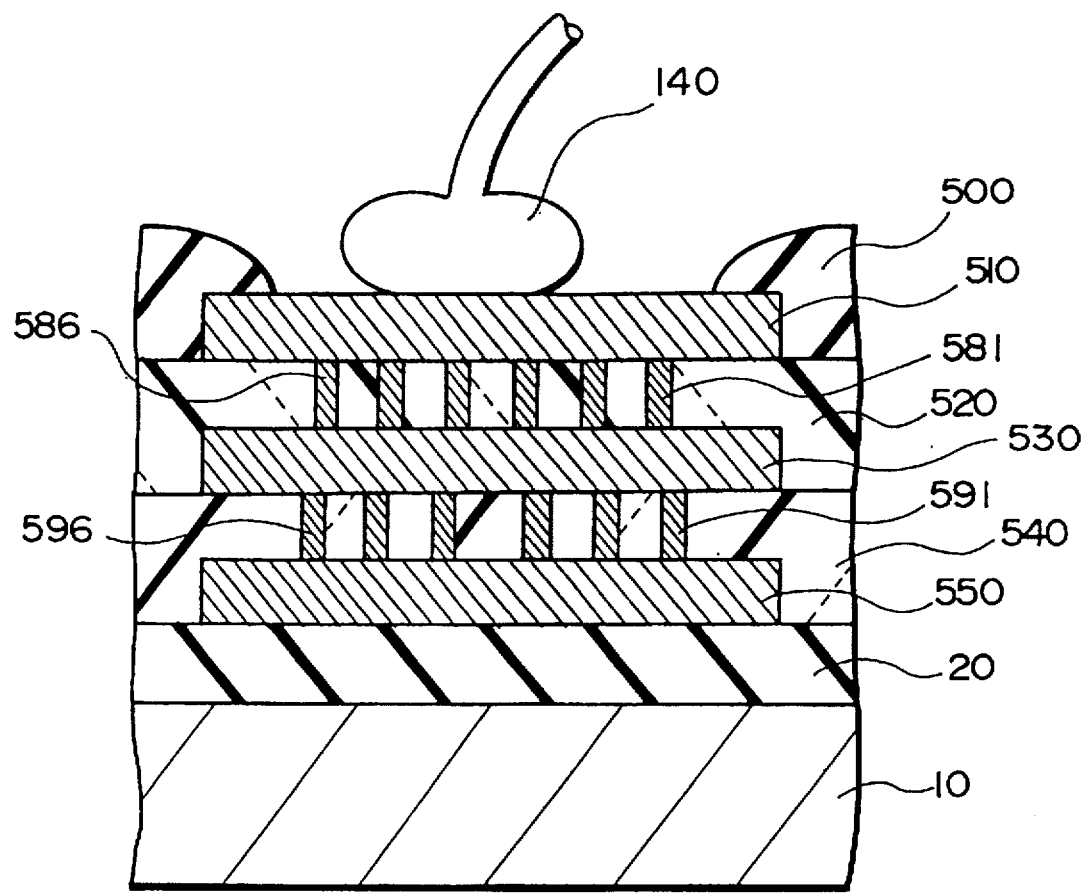
FIG. 12 is a sectional view of another modification of the fourth embodiment.

The structure of FIG. 11 is characterized by that interlayer connection conductors (606 and so on) in an interlayer insulation film 520 are disposed to be perfectly aligned with the respective interlayer connection conductors (616 and so on) in an interlayer insulation film 540. This provides the maximum mechanical strength. In some cases, however, interlayer connection conductors (586 and so on) may be slightly offset from interlayer connection conductors (596 and so on) with partial overlaps, as shown in FIG. 12.

Figure 14:
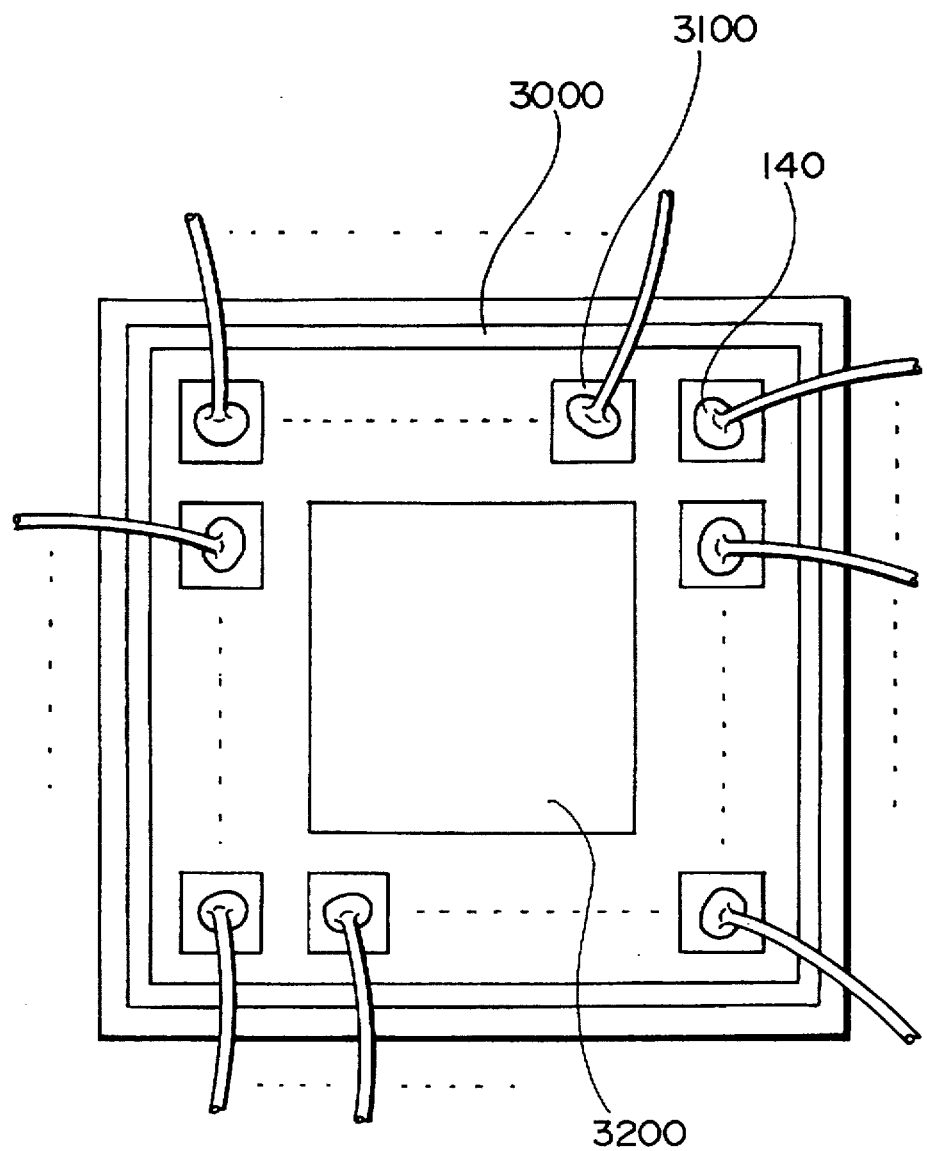
FIG. 14 is a view showing the layouts of a bonding pad and internal circuit in a semiconductor chip.

As shown in FIG. 14, the bonding pads are generally arranged along the peripheral edges of the semiconductor chip, as shown in FIG. 14. The present invention can increase the layout density of the bonding pads.

(5) Fifth Embodiment

A method of making a semiconductor device according to the present invention will now be described with reference to FIGS. 13–20.

Figure 13:
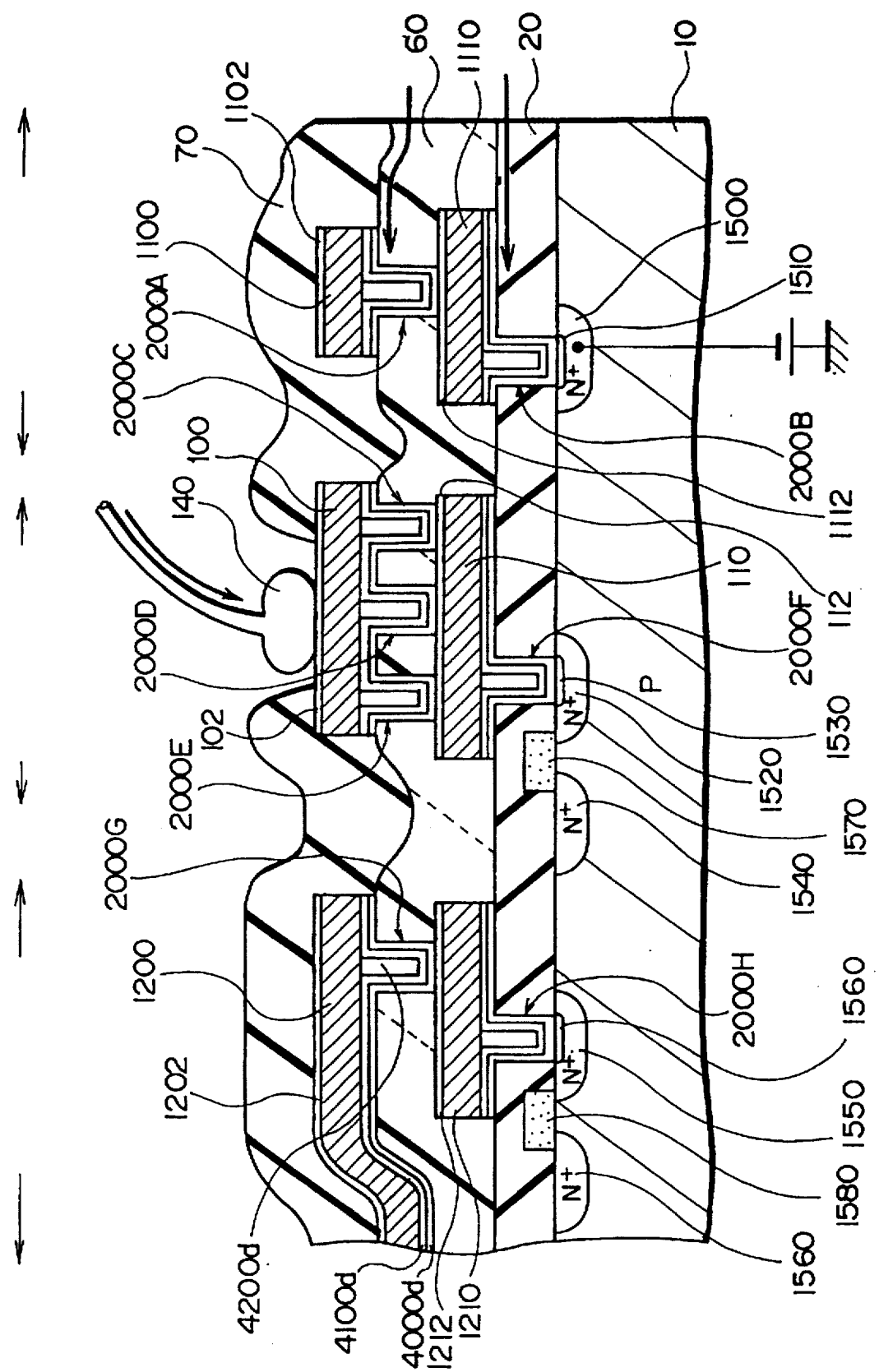
FIG. 13 is a sectional view showing the details of a semiconductor device constructed in accordance with the present invention.

FIG. 13 shows the details of such a guard ring 3000, bonding pads 3100 and internal circuit 3200 as shown in FIG. 14.

A process for making the structure of FIG. 13 will be described in sequence.

Figure 15:
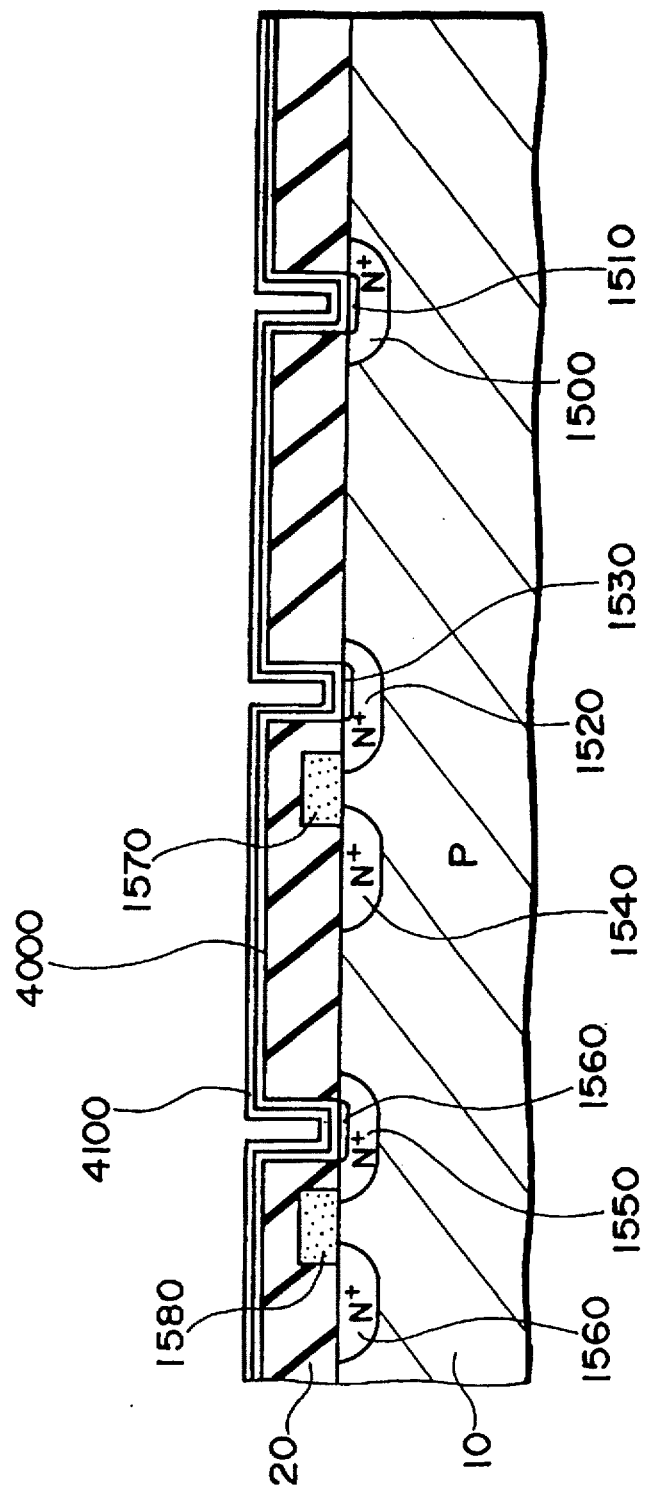
FIG. 15 is a view illustrating a first step for forming the structure of FIG. 13.

As shown in FIG. 15, first, an electronic circuit using MOS transistors is formed by forming gate electrodes 1580 and 1570 of polysilicon or the like and diffusion layers of impurity 1560, 1550, 1540, 1520 and 1500 on a semiconductor substrate 10. Second, contact holes are formed in an insulation film 20. Titanium (Ti) film 4000 and titanium nitride (TiN) film 4100 are sequentially deposited on the insulation film 20 through the overall surface thereof. The titanium (Ti) film functions to reduce the contact resistance while the titanium nitride (TiN) film functions to facilitate the embedment of tungsten (W) into the contact holes in the following step. In FIG. 15, reference numerals 1561, 1530 and 1510 designate titanium silicide (TiSi) layers.

Figure 16:
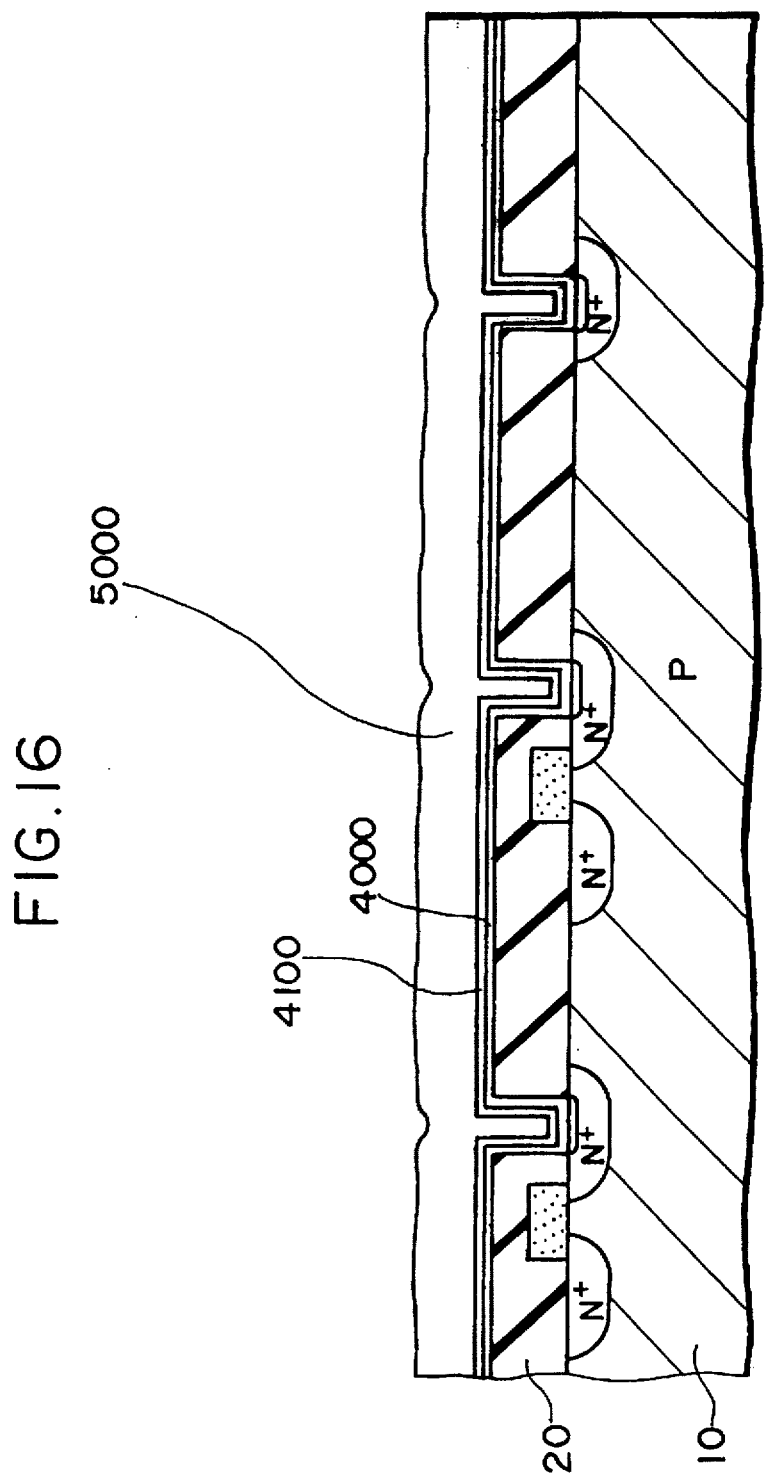
FIG. 16 is a view illustrating a second step for forming the structure of FIG. 13.

A tungsten (W) layer 5000 is then formed, as shown in FIG. 16.

Figure 17:
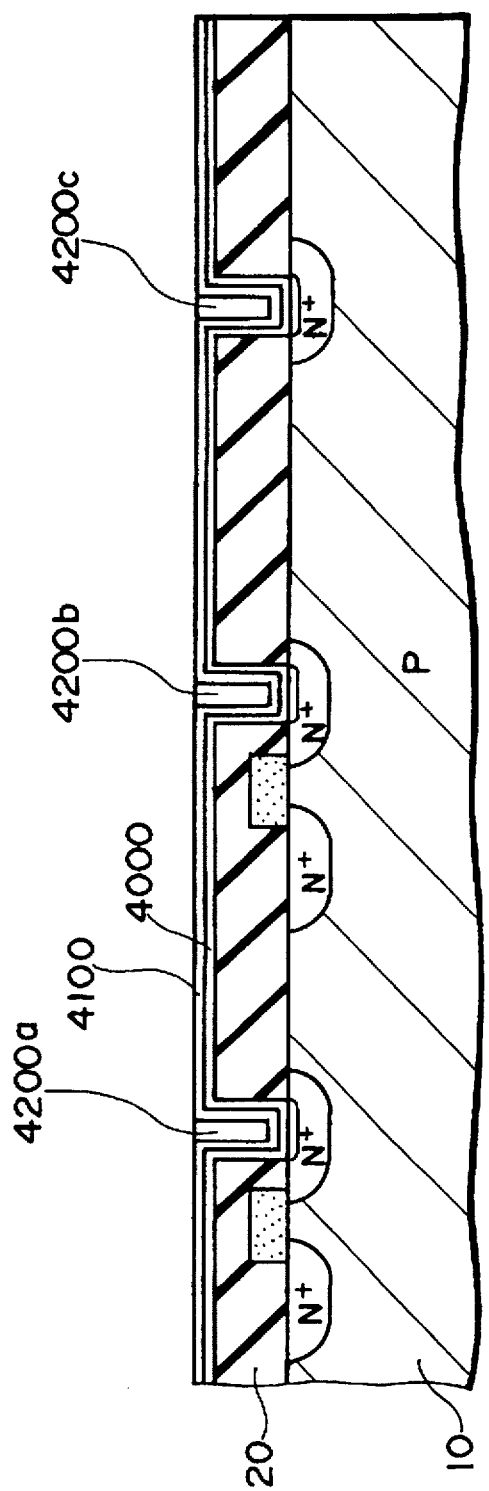
FIG. 17 is a view illustrating a third step for forming the structure of FIG. 13.

Subsequently, the overall surface of the tungsten layer 5000 is etched through RIE to embed the tungsten material into the contact holes, as shown in FIG. 17. Thus, embedded tungsten layers 4200a, 4200b and 4200c are formed.

Chlorine gas is used in the RIE performed to the tungsten layers. The chlorine gas is a cause wherein the aluminum wiring is corroded. To avoid such a problem, the method of the present invention forms the bonding pad at the same time when the multi-layered wiring structure in the internal circuit is formed. Therefore, the chlorine gas will not corrode the electrodes in the bonding pad. This improves the reliability in IC chips.

Figure 18:
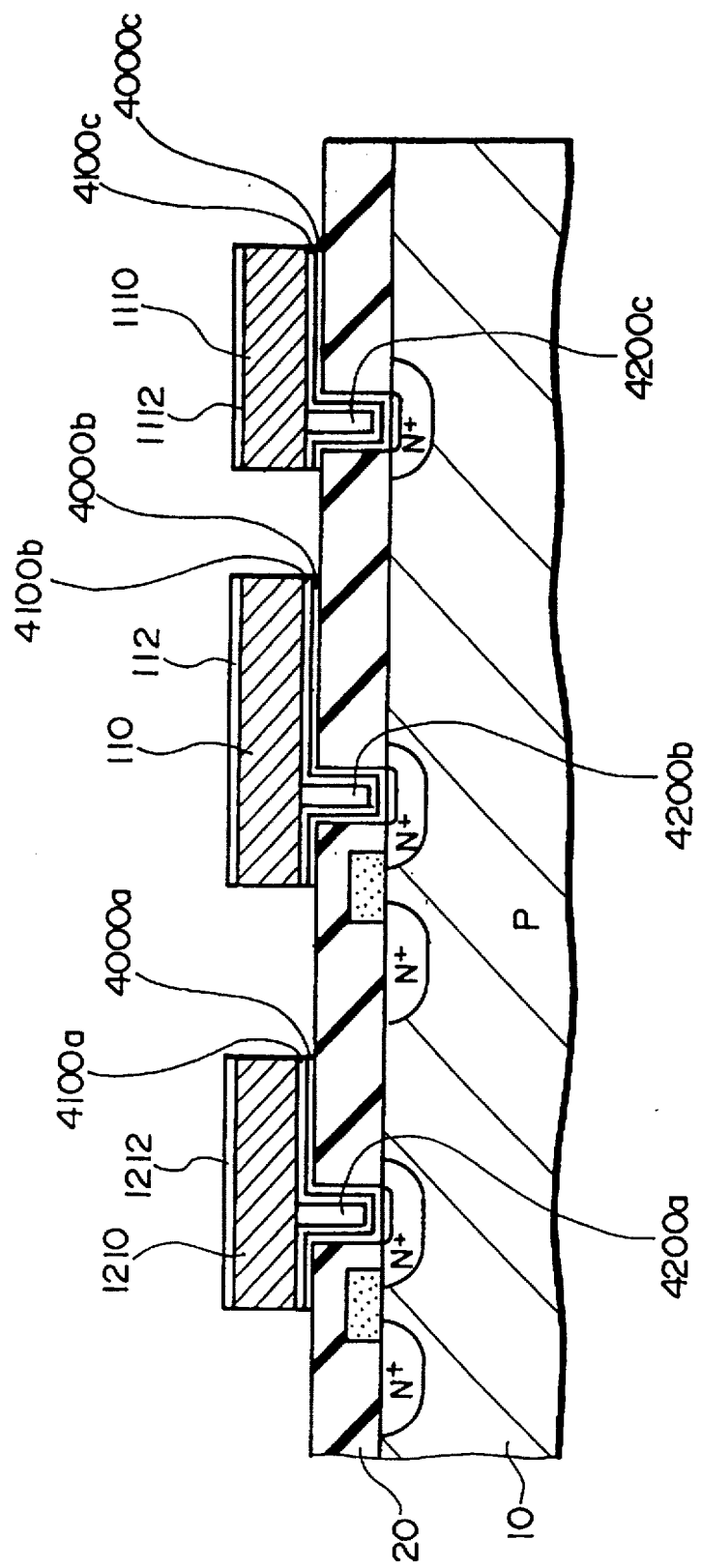
FIG. 18 is a view illustrating a fourth step for forming the structure of FIG. 13.

Subsequently, aluminum (Al) and titanium nitride (TiN) layers are stackedly formed and worked through the conventional photolithography to form such electrodes as shown by 1210 and 1212; 110 and 112; and 1110 and 1112 in FIG. 18. The titanium nitride (TiN) film functions to prevent the reflection of exposure light, that is, as a reflection preventing layer.

Figure 19:
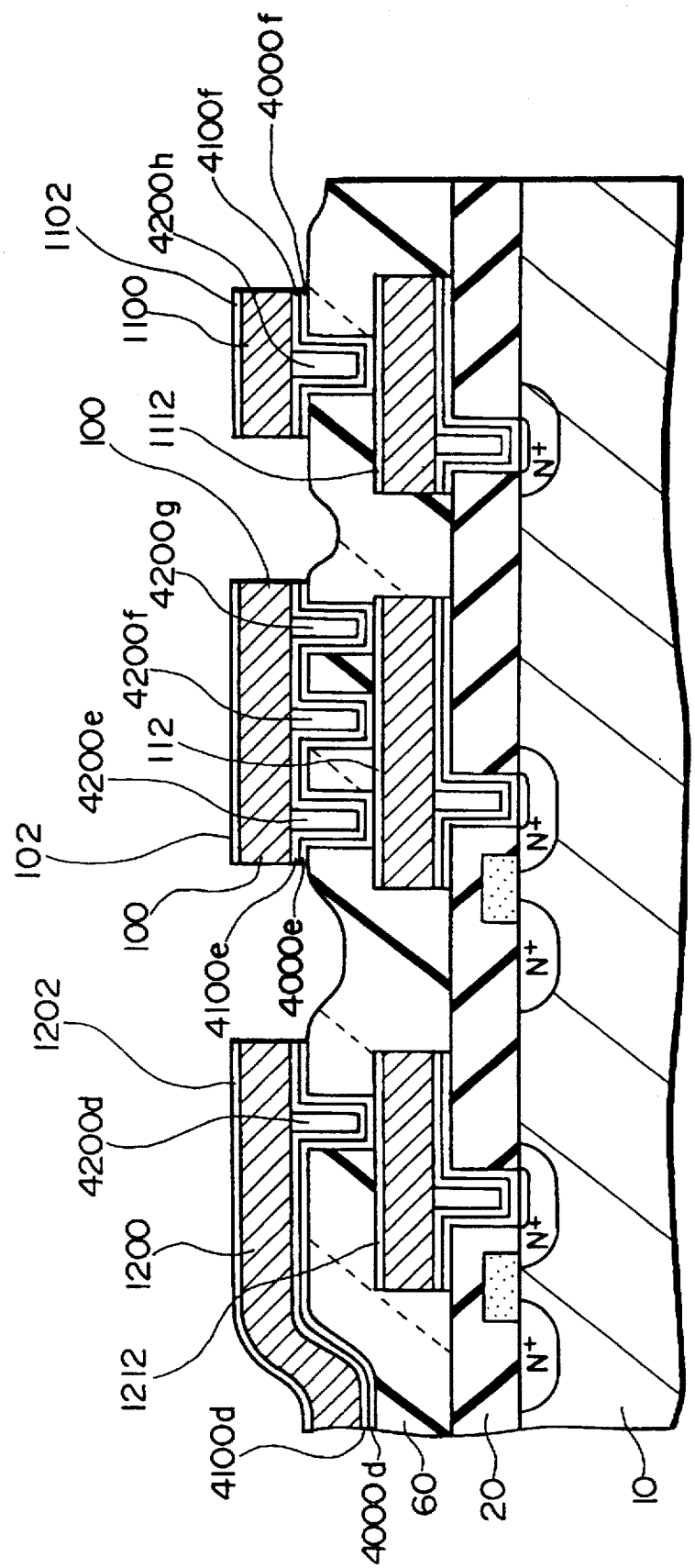
FIG. 19 is a view illustrating a fifth step for forming the structure of FIG. 13.

An interlayer insulation film 60 is then formed and through holes are selectively formed through the interlayer insulation film 60, as shown in FIG. 19. The same production process as shown in FIGS. 15–18 is made to form a second electrode layer. In FIG. 19, reference numerals 4000d, 4000e and 4000f denote titanium (Ti) films; 4100d, 4100e and 4100f titanium nitride (TiN) films; 4200d, 4200e and 4200h tungsten (W) layers; 1200, 100 and 1100 aluminum (Al) electrodes; and 1202, 102, 1102 reflection preventing layers of titanium nitride (TiN) film.

Figure 20:
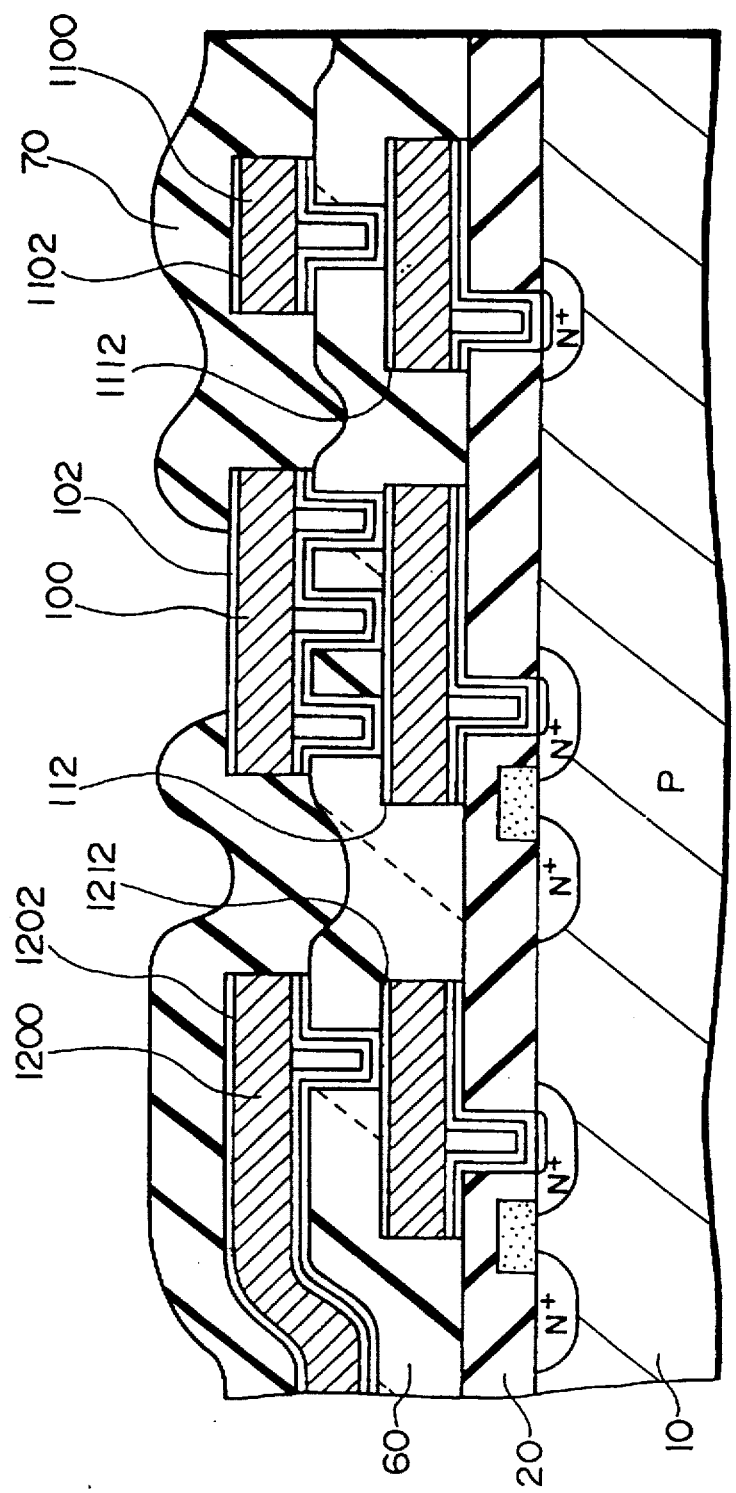
FIG. 20 is a view illustrating a sixth step for forming the structure of FIG. 13.

As shown in FIG. 20, a final protection film 70 is then formed. The final protection film 70 is selectively formed with openings each for a bonding pad.

A bonding wire 140 is then connected. A given potential is applied to a diffusion layer 1500 to maintain a guard ring (which is formed by the aluminum electrodes 1110, 1100 and so on) at a given potential. The guard ring can repel an ionic water to prevent moisture from entering through the outer periphery of the semiconductor chip as shown by arrow in FIG. 13.

The conductor embedded into the through hole 2000D directly below the bonding wire 140 will not be adversely affected by the moisture moved along the bonding wire 140 as shown by arrow in FIG. 13. Therefore, the bonding pad can be electrically connected to the other wiring layers in the reliable manner.

Even if the multi-layered structure has more layers, no step will be created in the structure. In other words, the flatness in the bonding pad can be maintained even if the metal electrodes are formed into more layers. Therefore, the wiring will not be disconnected. Furthermore, the bonding area can be reliably ensured to arrange the bonding pads with an increased density.

In FIG. 13, reference numerals 2000A, 2000D and 2000G designate through-holes while reference numerals 2000B, 2000F and 2000H denote contact holes.

The present invention may be similarly applied to any other application such as a substrate using a thin film in a liquid crystal device or the like, in addition to monolithic IC. The external connection is not limited to the bonding wire, but may be in the form of tape carrier or the like.

What is claimed is:

1. A semiconductor device having a multi-layered wiring structure comprising:

a first conductor layer connected to an external connection terminal;

a second conductor layer;

an electrical insulation layer interposed between said first and second conductor layers; and a third conductor layer embedded in a through hole selectively formed through said electrical insulation layer, said third conductor layer electrically connecting said first conductor layer to said second conductor layer;

wherein said third conductor layer is filled in said through hole, the height of the top and bottom of said third conductor layer being substantially equal to the height of the top and bottom of said electrical insulation layer and said third conductor layer is harder than said first and second conductor layers.

2. The semiconductor device as defined in claim 1 wherein a surface of said third conductor layer contacting said first conductor layer is covered with said external connection terminal.

3. The semiconductor device as defined in claim 1 wherein said first and second conductor layers contain aluminum as a chief component and wherein said third conductor layer contains tungsten as a chief component.

4. The semiconductor device as defined in claim 1, further comprising an internal circuit formed by a multi-layered wiring structure and wherein said first, second and third conductor layers, electrical insulation layer and through hole are formed through the same production process as forming said multi-layered wiring structure of said internal circuit.

5. The semiconductor device as defined in claim 1 wherein said external connection terminal is a bonding wire.

6. A semiconductor device having a multi-layered wiring structure comprising:

a first conductor layer connected to an external connection terminal;

a second conductor layer;

an electrical insulation layer interposed between said first and second conductor layers; and a plurality of third conductor layers each embedded in one of a plurality of through holes selectively formed through said electrical insulation layer, said third conductor layers electrically connecting said first conductor layer to said second conductor layer;

wherein each of said third conductor layers is filled in the corresponding one of said through holes, the height of the top and bottom of the third conductor layer being substantially equal to the height of the top and bottom of said electrical insulation layer and said third conductor layers are arranged into a matrix; and wherein a surface of at least one of said third conductor layers contacting said first conductor layer is covered with said external connection terminal.

7. The semiconductor device is defined in claim 6 wherein said third conductor layers are arranged into a plurality of lines forming a matrix of even number lines and odd number lines, the even number lines being staggered from the odd number lines in said matrix.

8. The semiconductor device as defined in claim 6 wherein said third conductor layers are arranged into concentric circles.

9. A semiconductor device having a multi-layered wiring structure comprising:

a first conductor layer connected to an external connection terminal;

a second conductor layer;

an electrical insulation layer interposed between said first and second conductor layers; and a third conductor layer embedded into a groove selectively formed in said electrical insulation layer, said third conductor layer electrically connecting said first conductor layer to said second conductor layer;

wherein said third conductor layer is filled in said groove, the height of the top and bottom of said third conductor layer being substantially equal to the height of the top and bottom of said electrical insulation layer.

10. The semiconductor device as defined in claim 9, wherein said third conductor layer embedded into said groove is formed into a closed configuration, said electrical insulation layer being partitioned into inner and outer portions about said closed configuration;

wherein said inner portion of said electrical insulation layer includes a through hole selectively formed therethrough, said through hole including a fourth conductor layer embedded thereinto and formed of the same material as in said third conductor layer; and wherein said external connection terminal is connected to said first conductor layer to cover said fourth conductor layer.

11. A semiconductor device having a multi-layered wiring structure comprising:

a first conductor layer connected to an external connection terminal;

a second conductor layer;

a third conductor layer formed to have an overlap relative to said second conductor layer;

a first electrical insulation layer interposed between said first and second conductor layers;

a second electrical insulation layer interposed between said second and third conductor layers;

a fourth conductor layer embedded into a first through hole selectively formed through said first electrical insulation layer, said fourth conductor layer electrically connecting said first conductor layer to said second conductor layer; and a fifth conductor layer embedded into a second through hole selectively formed through said second electrical insulation layer, said fifth conductor layer electrically connecting said second conductor layer to said third conductor layer;

a guard ring located at a position nearer an outer periphery of the semiconductor device than the position at which said external connection terminal is connected to the semiconductor device, said guard ring having a given potential;

wherein said fourth conductor layer is filled in said first through hole such that the height of the top and bottom of said fourth conductor layer is substantially equal to the height of the top and bottom of said first electrical insulation layer;

wherein said fifth conductor layer is filled in said second through hole such that the height of the top and bottom of said fifth conductor layer is substantially equal to the height of the top and bottom of said second electrical insulation layer; and wherein said fourth and fifth conductor layers in said first and second through holes have an overlap.

* * * * *